(12) United States Patent
Onvlee et al.

(10) Patent No.: US 7,933,000 B2
(45) Date of Patent: Apr. 26, 2011

(54) DEVICE MANUFACTURING METHOD, METHOD FOR HOLDING A PATTERNING DEVICE AND LITHOGRAPHIC APPARATUS INCLUDING AN APPLICATOR FOR APPLYING MOLECULES ONTO A CLAMP AREA OF A PATTERNING DEVICE

(75) Inventors: Johannes Onvlee, 's-Hertogenbosch (NL); Dirk-Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1158 days.

(21) Appl. No.: 11/600,325

(22) Filed: Nov. 16, 2006

(65) Prior Publication Data
US 2008/0117391 A1 May 22, 2008

(51) Int. Cl.
G03B 27/62 (2006.01)
(52) U.S. Cl. .......................................................... 355/75
(58) Field of Classification Search ............... 355/30, 355/75; 430/5
See application file for complete search history.

(56) References Cited

U.S. PATENT DOCUMENTS

| | | | | |
|---|---|---|---|---|
| 5,534,969 | A * | 7/1996 | Miyake | 355/53 |
| 6,573,201 | B1 * | 6/2003 | Ogure et al. | 29/25.01 |
| 6,806,943 | B2 * | 10/2004 | Barringer et al. | 355/75 |
| 6,842,221 | B1 * | 1/2005 | Shiraishi | 355/30 |
| 6,888,621 | B2 * | 5/2005 | Araki et al. | 355/75 |
| 2001/0026355 | A1 * | 10/2001 | Aoki et al. | 355/30 |
| 2005/0117142 | A1 * | 6/2005 | Heerens et al. | 355/75 |
| 2006/0017893 | A1 * | 1/2006 | Mertens et al. | 355/30 |
| 2006/0038973 | A1 * | 2/2006 | Galburt | 355/75 |
| 2006/0279721 | A1 * | 12/2006 | Baggen et al. | 355/72 |
| 2007/0099099 | A1 * | 5/2007 | Onvlee et al. | 430/30 |
| 2007/0182947 | A1 * | 8/2007 | Hempenius et al. | 355/75 |
| 2007/0258081 | A1 * | 11/2007 | Baggen et al. | 355/75 |
| 2007/0268476 | A1 * | 11/2007 | Phillips et al. | 355/75 |
| 2008/0100819 | A1 * | 5/2008 | Onvlee et al. | 355/75 |
| 2009/0027649 | A1 * | 1/2009 | De Boer et al. | 355/73 |
| 2010/0265486 | A1 * | 10/2010 | De Jong et al. | 355/72 |

FOREIGN PATENT DOCUMENTS
JP 2004140271 A * 5/2004

OTHER PUBLICATIONS

Machine translation of JP 2004-140271 A, May 13, 2004.*
Human translation of paragraph [0057] of JP 2004-140271 A, May 13, 2004.*

* cited by examiner

Primary Examiner — Hung Henry Nguyen
Assistant Examiner — Steven H Whitesell-Gordon
(74) Attorney, Agent, or Firm — Pillsbury Winthrop Shaw Pittman LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate. An applicator, such as a humidifier is provided to provide molecules, such as water molecules, to a clamp area of the patterning device.

13 Claims, 2 Drawing Sheets

DEVICE MANUFACTURING METHOD, METHOD FOR HOLDING A PATTERNING DEVICE AND LITHOGRAPHIC APPARATUS INCLUDING AN APPLICATOR FOR APPLYING MOLECULES ONTO A CLAMP AREA OF A PATTERNING DEVICE

BACKGROUND

1. Field

The present invention relates to a lithographic apparatus, a method to hold a patterning device in a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, the patterning device may appear to be subjected to a degradation process during a use thereof. After a period of use of the patterning device, the patterning device may appear to show haze, thereby deteriorating a performance thereof, as a transmissivity (of a transmissive patterning device) or a reflectivity (of a reflective patterning device) may be deteriorated. An occurrence of haze generally requires a cleaning of the patterning device, which may enable to remove or at least reduce such haze. The cleaning may however require a use of etching cleaning agents or other cleaning substances or cleaning methods, which may interact with the patterning device, causing the patterning device to wear or otherwise degrade. Because of such adverse effects on the patterning device, a replacement thereof may be required after having cleaned the patterning device one or several times.

In a scanning type lithographic apparatus, the patterning device may be carried by a support, also referred to as a mask or support table. While generating a pattern on a target portion of a substrate, the mask table performs scanning movements along a line of movement, in a single scan direction or scanning in both (i.e. opposite) directions along the line of movement. When a reversal of direction takes place, the mask table is decelerated and accelerated between the successive scanning movements. Also, the mask table is accelerated and decelerated before and after each scanning movement in a specific direction. Conventionally, the scanning movements are made with constant velocity. However, the scanning movements may also at least partly be made with varying velocity, e.g. the movements including at least part of the deceleration and/or acceleration phases.

The mask table supports, i.e. bears the weight of, the mask. It holds the mask in a manner that depends on the orientation of the mask, the design of the lithographic apparatus, and other conditions, such as for example whether or not the mask is held in a vacuum environment. The mask table may include a frame or a table, for example, which may be fixed or movable as required. The mask table (and its control system) may ensure that the mask is at a desired position, for example with respect to the projection system.

The mask is coupled to the mask table through a clamp. Conventionally, the mask is coupled to the mask table through a vacuum clamp which may be implemented as one or more vacuum pads provided on the mask table, where at least a part of a circumferential area of the mask is held onto the vacuum pads. By the clamp, a normal force between adjacent surfaces of the mask and the mask table is generated, resulting in a friction between contacting surfaces of the mask and the mask table. The vacuum pads include one or more openings coupled to a gas discharge and supply system. Instead of a vacuum coupling between the mask and the mask table, other forms of couplings based on friction between the mask and the mask table are conceivable, such as electrostatic or mechanical clamping techniques to hold the mask against the mask table.

In an ongoing development, increasing throughput requirements placed on lithographic apparatus lead to increasing scanning velocities. Consequently, deceleration and acceleration of the mask table increase. In the deceleration and acceleration phases, increased inertia forces act on the mask table and on the mask.

It is known that inertia forces acting on the mask relative to the mask table may lead to slip of the mask and the mask table relative to each other. Although slip usually is in the order of nanometers, prevention of such slip is still important to meet product overlay requirements of state of the art lithographic systems. For relatively low decelerations and accelerations, the slip has appeared to be low. In such circumstances, the slip may be ignored if it is sufficiently low, or the slip, if occurring, may possibly be compensated by suitably calibrating a positioning device controlling the position (and hence, the movement) of the mask table and/or the substrate stage.

However, with increasing decelerations and accelerations, the slip occurring between the mask and the mask table increases, and becomes variable and unpredictable. Factors influencing the amount of slip may include, but may not be limited to, a flatness and roughness of the surfaces of the mask and the mask table engaging each other, a humidity of the atmosphere(s) in which the mask and the mask table are handled, a chemical surface contamination of the mask or the mask table, a particle contamination of the mask or the mask table, and in case of a vacuum clamp system, a degree of vacuum when the mask is held on the mask table by vacuum pads. Thus, a calibration of the positioning device will not lead to a correct positioning of the mask table and/or the substrate stage under the circumstances of high inertia forces.

Not only the speed of movement and acceleration of the mask table may tend to increase, also, accuracy requirements on the lithographic apparatus may become more stringent. Therefore, slip of the mask becomes less tolerable, as slip of the mask may result in a position error of the pattern projected onto the substrate.

SUMMARY

It is desirable to prevent a slip of the patterning device with respect to the support.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes an applicator to apply molecules onto a clamp area of the patterning device.

In another embodiment of the invention, there is provided a method to hold a patterning device in a lithographic apparatus, the method including applying molecules onto a clamp area of the patterning device; and clamping the clamp area of the patterning device to a support of the lithographic apparatus, the support being constructed to support the patterning device.

According to a further embodiment of the invention, there is provided a device manufacturing method including supporting a patterning device by a support, the patterning device being capable of imparting a radiation beam with a pattern in its cross-section to form a patterned radiation beam; projecting by the radiation beam the pattern onto a substrate, developing the substrate, and manufacturing a device from the developed substrate, wherein molecules are applied onto a clamp area of the patterning device before being supported by the support.

According to another embodiment of the invention, there is provided a device manufacturing method including conditioning a beam of radiation; applying molecules onto a clamp area of a patterning device, the patterning device capable of imparting the beam of radiation with a pattern in its cross-section to form a patterned radiation beam; clamping the patterning device on a support, and projecting the patterned radiation beam onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
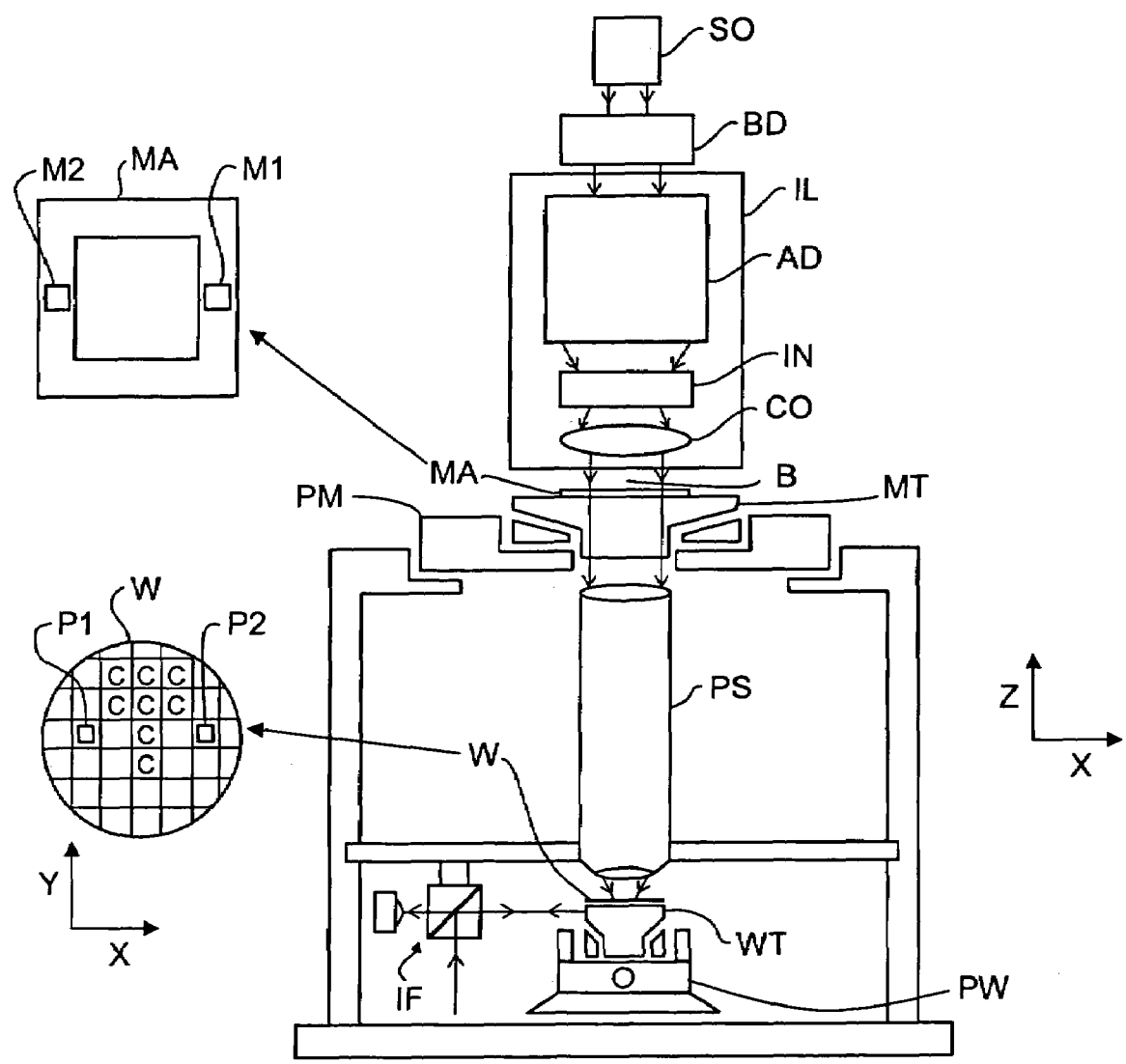
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure or a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to=FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PL, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
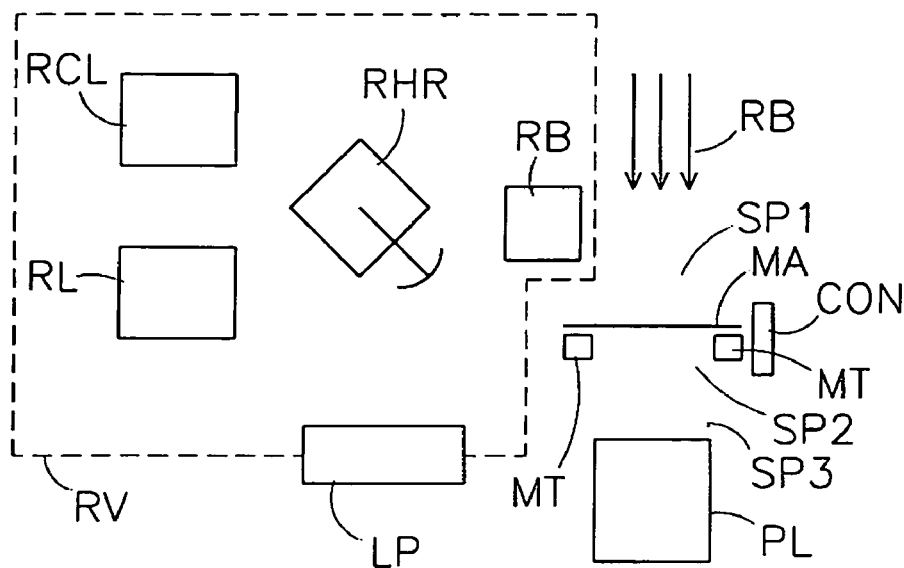
FIG. 2 depicts a schematic view of a part of the lithographic apparatus according to an embodiment the invention.

FIG. 2 schematically depicts a patterning device support (e.g., a mask table) MT holding a mask or patterning device MA, a projection system PL, and a substrate table WT holding a substrate W. A radiation beam which may be generated by a source of radiation (not shown) is patterned by a pattern of the mask and projected onto the substrate W by the projection system PL. The inventors have now realized that the occurrence of a haze on a surface of the patterning device is due to humidity. Actually, the inventors have realized that water molecules which attach to the surface of the patterning device chemically react with the patterning device when the patterning device is irradiated by the irradiation beam, which may include a highly energetic, short wavelength radiation. The inventors have realized that the haze, which may occur on the patterning device (e.g., mask), is due to this interaction with water molecules. A conditioner, schematically indicated by CON, is provided which conditions a space SP1 and/or SP2 adjacent to the to be irradiated surface of the patterning device. The conditioner provides for a substantially humid free environment in the space. As example, the conditioner may purge the space with dry nitrogen or with XCDA (extremely clean dry air). Thereby, a generation of haze on the patterning device may be significantly reduced, causing a less frequent need to clean the patterning device, which may reduce a wear thereof and consequently may increase a usable lifetime of the patterning device.

Not only one or both of the spaces SP1, SP2 adjacent to a surface of the patterning device may be conditioned, also a conditioning of other locations where the patterning device may be present in the lithographic apparatus, may be conditioned. As an example, a space SP3 adjoining a lens of the projection system PL, a patterning device library (e.g., a mask or reticle library) RL where one of more patterning devices (e.g., masks or reticles) may be stored, can be conditioned, a patterning device cleaner (e.g., a mask or reticle cleaner) RCL or a patterning device buffer (e.g., a mask buffer or reticle buffer) RB to patterning device stage (e.g., a mask stage or reticle stage) (also referred to as turret) may be conditioned, a robot handling area of the patterning device handling robot (e.g., a mask handling robot or a reticle handling robot) RHR may be conditioned, the reticle handling robot to access the library RL, cleaner RCL, buffer RB and/or load port LP). Further, an internal patterning device inspection system (e.g., an internal mask device inspection system or an internal reticle inspection system) may be conditioned. Also, it is possible that an entire patterning device handling volume (e.g., a mask handling volume or reticle handling volume) RV is conditioned. Further, this conditioning may include the space in which the support MT, projection system PL and/or substrate table WT are provided. The conditioning may include a substantially humidity free conditioning, to prevent water molecules from forming a molecular layer on the patterning device. In the examples provided above, a space adjoining the to be irradiated surface of the patterning device may be conditioned, however it may also be the case that a space surrounding the entire patterning device is conditioned. Generally speaking, the to be irradiated surface of the patterning device includes a part of the surface between the sides where the patterning device is held by the support. The surface may include a surface of the patterning device or reticle itself, and/or a surface of the pellicle which will be explained with reference to FIGS. 3 and 4 below.

The conditioning may also be applied to condition a surface of other parts which are to be irradiated by the radiation beam, such as a surface of a lens of the projection system PL.

The inventors have devised that a film of water, i.e. a film of humidity, even if having a thickness of one of more molecules only, will severely improve a friction coefficient between the patterning device (e.g. the mask or reticle) and the support. An explanation for this observation may be found in the fact that the water molecules will fill gaps that exist on a molecular scale between the patterning device (e.g. the mask or reticle) and the support. Other effects may play a role too. As explained above, insufficient humidity is present in the patterning device (e.g. the mask or reticle) handling area, e.g. in a patterning device (e.g. the mask or reticle) storage, around the support, around the projection system, to provide for such a molecular water film. Instead of a humidifier (such as a nozzle, sprayer, vaporizer) to provide water molecules, any other applicator to apply molecules onto the clamp area, may be applied. Examples of the molecules may include polar molecules e.g. included in a polar liquid, or any other molecules having an adherence to the clamp area. Furthermore, the molecules may include any molecule that will increase a friction between the patterning device and the support, by the effect described above or in any other way. The applicator may include any type of applicator, e.g. a nozzle to provide a liquid, gas or any mixture, an evaporator etc.

The applicator may include a container or a duct to hold the molecules to be applied onto the clamp area.

As explained above, the water film on the patterning device (e.g. the mask or reticle) also provides for an adverse effect, i.e. a generation of haze on the patterning device (e.g. the mask or reticle) under influence of the radiation. Therefore, during exposure of the patterning device (e.g. the mask or reticle), an environment that is sufficiently free of humidity to prevent a forming of a molecular scale water film, even if having a thickness of one of more molecules only, on the patterning device (e.g. the mask or reticle) is desired. Thereby however, risking that a friction is reduced causing a low holding force of the patterning device (e.g. the mask or reticle) clamp.

Figure 3:
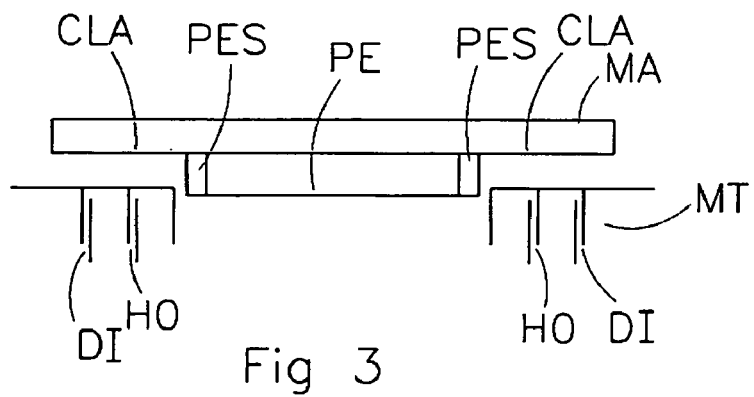
FIG. 3 depicts a schematic view of a support of a lithographic apparatus according to an embodiment of the invention, the support holding a patterning device.

FIG. 3 shows patterning device (e.g. the mask or reticle) MA held by support MT. The patterning device (e.g. the mask or reticle) is in this example provided with a pellicle held by pellicle supports PES. A pattern may be provided on a bottom side of the patterning device (e.g. the mask or reticle), and thereby be shielded to some extent by the pellicle PE against dust, haze or damage in a plane of focus of the projection system. The support includes a humidifier which in this example includes outlet HO to humidify clamp area CLA of the patterning device (e.g. the mask or reticle). Humidifying is in this context to be understood as a providing of a small amount of a humidified gas that will enable a generation of a molecular water film on the to be clamped surface. The humidifier may include any humidifier, such as a nozzle, sprayer, an outlet for a humidified gas, etc. The gas may include a pure gaseous substance, a gas mixture, etc. In an embodiment, the humidifier provides for a small amount of humidified gas just before the patterning device (e.g. the mask or reticle) handling robot places the patterning device (e.g. the mask or reticle) on the support. In the position shown in FIG. 3, a distance between a clamp surface of the support MT and the clamp area of the patterning device (e.g. the mask or reticle) is less than or equal to a height of the pellicle support. Thereby, the pellicle support forms in this position a boundary to prevent, to a certain extent, the humidity from escaping towards the pellicle and therefore from forming a film on the pellicle, which would have the undesired effects as described above. Further, to avoid the humidity from reaching the pellicle or reach other, undesired locations, a discharge inlet DI may be provided in the support, the discharge inlet to guide away at least a part of the humidity provided by the humidifier, i.e. in this example the humidity provided via the outlet HO. Furthermore, a volume as provided via the humidifier outlet may substantially correspond to a volume as guided away be the discharge inlet DI, to further prevent humidity from escaping from the clamp area. In another embodiment, in case that the reticle clamp of the support includes a vacuum clamp, the discharge outlet DI may be formed by a vacuum suction duct of the vacuum clamp, in which case a flow rate or a volume guided away by the vacuum duct may exceed an amount provided by the humidifier outlet HO to generate a vacuum suction force.

Figure 4:
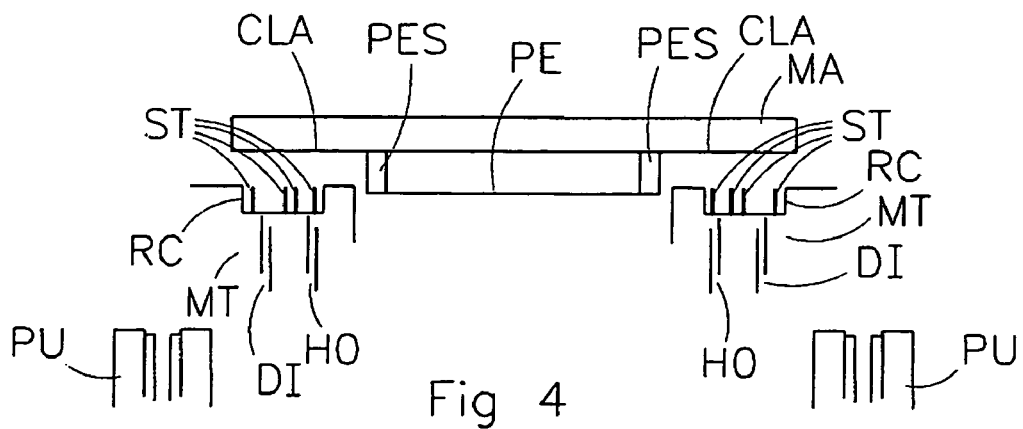
FIG. 4 depicts a schematic view of a part of the support as depicted in FIG. 3 in accordance with an embodiment of the invention.

In the embodiment shown in FIG. 4, a recess RC is provided in the support. The humidifier output HO provides an amount of humidity just before the patterning device (e.g. the mask or reticle) is placed on the support, i.e. when only a small gap remains between the patterning device (e.g. the mask or reticle) clamp area CLA and the support MT, a height of the gap e.g. being less than or equal to a height of pellicle support PES, as explained above. An amount of gas provided by the output HO may substantially correspond to a volume of the recess RC to enable the water to form a molecular film on the patterning device (e.g. the mask or reticle) clamp area of the patterning device (e.g. the mask or reticle) MA and the support MT quickly while largely preventing a leaking away of the humidity. The recess may include structures ST to contact the patterning device (e.g. the mask or reticle). Instead of or in addition to providing the discharge outlet, the humidified gas, or part thereof, may be allowed to escape at a side facing away from the pellicle support PES. To avoid such escaping humidity from contacting a to be exposed surface of the patterning device (e.g. the mask or reticle), a purging with a dry gas may be provided by a purger PU to supply an upwardly directed gas flow.

The humidifier, examples of which have been described with reference to FIGS. 3 and 4, can be applied in a lithographic apparatus as depicted in and described with reference to FIG. 2. Before exposure, the patterning device (e.g. the mask or reticle) handling robot moves the patterning device (e.g. the mask or reticle) to a buffer, such as the library RL, and form there the patterning device (e.g. the mask or reticle) is transferred to the stage, possibly passing patterning device (e.g. the mask or reticle) buffer RB. By the conditioning as described above, the patterning device (e.g. the mask or reticle) will be delivered to the stage substantially water free. A volume between the patterning device (e.g. the mask or reticle) surface itself and the pellicle may have been conditioned too, as the pellicle frame may contain suitable venting openings. The humidifying as explained above, e.g. with reference to FIGS. 3 and/or 4, may then take place when the patterning device (e.g. the mask or reticle) is placed on the support by the patterning device (e.g. the mask or reticle) handling robot.

In alternative embodiments, the humidifier may be provided in a gripper of the patterning device (e.g. the mask or reticle) handling robot RHR which may provide water molecules (e.g. by a suitable nozzle or outlet) to the clamp area of the patterning device (e.g. the mask or reticle) when transporting the patterning device (e.g. the mask or reticle) to the support. In such embodiments, the patterning device (e.g. the mask or reticle) handling robot may be provided with a gripper having a humidifier similar as described with reference to FIG. 3 and/or FIG. 4. In still further embodiments, the humidifier may be provided in the patterning device (e.g. the mask or reticle) buffer RB, to apply water molecules to the clamp area, before the reticle is provided to the support. In these embodiments, the patterning device (e.g. the mask or reticle) buffer may be provided with a gripper or holder having a humidifier similar as described with reference to FIG. 3 and/or FIG. 4.

As outlined previously, in each of the exemplary embodiments described in this document, instead of a humidifier to apply water molecules, any other applicator may be provided, the applicator to apply molecules such as polar molecules or any other molecules that have an adherence to the clamp area of the support.

Making use of the teaching as described in this document, a device (such as a semiconductor device) can be manufactured by supporting a patterning device by a support, the patterning device being capable of imparting a radiation beam with a pattern in its cross-section to form a patterned radiation beam, projecting by the radiation beam the pattern onto a substrate, developing the substrate, and manufacturing the device from the developed substrate, wherein molecules are applied onto the clamp area of the patterning device before being supported by the support. Thereby a friction between the patterning device and the support is increased, hence decreasing a slip of a risk of slip of the patterning device relative to the support.

The conditioner as mentioned in this document, may be included of a single conditioner, however it is equally well possible that a plurality of conditioners are provided, e.g. separate conditioners for the reticle storage, the support, etc.

The humidifier as described above, in all its possible embodiments, may also be applied as such, i.e. omitting the conditioner.

The conditioning and humidification as described above may not only be applied in a lithographic apparatus internally operating at atmospheric pressure: applications at lower or higher pressure are possible as well.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate, and
an applicator to apply molecules onto a clamp area of the patterning device,
wherein the applicator comprises a humidifier to humidify the clamp area of the patterning device.

2. The lithographic apparatus according to claim 1, wherein the humidifier is comprised in the support.

3. The lithographic apparatus according to claim 2, wherein the humidifier comprises an outlet in a clamp area of the support to guide a gas comprising a water vapor to the clamp area of the patterning device.

4. The lithographic apparatus according to claim 3, wherein the humidifier further comprises a discharge inlet to guide away at least a part of the gas provided by the outlet.

5. The lithographic apparatus according to claim 4, wherein the humidifier is constructed such that an amount of gas provided by the outlet is at least equal to an amount or gas guided away by the discharge inlet.

6. The lithographic apparatus according to claim 4, wherein the clamp of the support comprises a vacuum clamp, the discharge inlet being a vacuum suction inlet of the clamp.

7. The lithographic apparatus according to claim 4, wherein the clamp of the support comprises a vacuum clamp, the support including a recess to form a vacuum chamber of the vacuum clamp when holding the patterning device, the humidifier to provide via the outlet a quantity of the gas to substantially fill the vacuum chamber when the patterning device is transported to the support.

8. The lithographic apparatus according to claim 1, wherein the humidifier is comprised in a storage device of the lithographic apparatus, the storage device to store the patterning device before being transported to the support.

9. The lithographic apparatus according to claim 1, wherein the humidifier is comprised in a patterning device handling robot, the patterning device robot to transport the patterning device from a storage device to the support.

10. The lithographic apparatus according to claim 1, further comprising a conditioner configured to condition at least a space adjoining a surface of the patterning device when the patterning device is irradiated by the radiation beam, the conditioner to provide a substantially humid free environment in the space.

11. The lithographic apparatus according to claim 1, further comprising a storage device conditioner to condition at least a space in a storage device adapted to store the patterning device, the space adjoining a surface of the patterning device when stored in the storage device, the surface of the patterning device to be irradiated by the radiation beam.

12. The lithographic apparatus according to claim 1, wherein the molecules include polar molecules.

13. The lithographic apparatus according to claim 1, wherein the molecules include water.

* * * * *